US009036678B2

(12) United States Patent
Raju et al.

(10) Patent No.: US 9,036,678 B2
(45) Date of Patent: May 19, 2015

(54) LIGHT EMITTING SEMICONDUCTOR DEVICE

(75) Inventors: Reddy Raju, Fremont, CA (US); Richard L. Duesterberg, Mountain View, CA (US); Jay A. Skidmore, San Jose, CA (US); Prasad Yalamanchili, Santa Clara, CA (US); Xiangdong Qiu, Cupertino, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 337 days.

(21) Appl. No.: 12/844,698

(22) Filed: Jul. 27, 2010

(65) Prior Publication Data
US 2011/0026558 A1 Feb. 3, 2011

Related U.S. Application Data

(60) Provisional application No. 61/229,171, filed on Jul. 28, 2009.

(51) Int. Cl.
*H01S 3/08* (2006.01)
*G02B 6/42* (2006.01)
*H01S 5/022* (2006.01)
*H01S 5/024* (2006.01)

(52) U.S. Cl.
CPC ............. *G02B 6/423* (2013.01); *Y10T 29/41* (2015.01); *H01S 5/02216* (2013.01); *H01S 5/02252* (2013.01); *H01S 5/02276* (2013.01); *H01S 5/02284* (2013.01); *H01S 5/02415* (2013.01); *H01S 5/02476* (2013.01); *H01L 2224/48465* (2013.01)

(58) Field of Classification Search
CPC ........... H01S 5/02284; H01S 5/02248; H01S 5/02252
USPC ............. 385/14, 88, 137; 438/26, 27; 257/98, 257/433, 712, E21.499; 372/34, 36, 108
See application file for complete search history.

(56) References Cited

U.S. PATENT DOCUMENTS

| 3,840,889 | A | * | 10/1974 | O'Brien et al. ................. 372/36 |
| 4,523,802 | A | * | 6/1985 | Sakaguchi et al. ............. 385/91 |
| 4,722,586 | A |   | 2/1988 | Dodson et al. .................. 385/92 |
| 4,752,109 | A | * | 6/1988 | Gordon et al. .................. 385/14 |
| 4,807,956 | A | * | 2/1989 | Tournereau et al. ............ 385/91 |
| 4,984,866 | A | * | 1/1991 | Boisgontier et al. ............ 385/49 |

(Continued)

FOREIGN PATENT DOCUMENTS

WO WO 2008006387 A1 * 1/2008 ............... H01S 5/14

*Primary Examiner* — Julio J Maldonado
*Assistant Examiner* — Joshua King
(74) *Attorney, Agent, or Firm* — JDS Uniphase Corporation

(57) ABSTRACT

A fiber coupled semiconductor device and a method of manufacturing of such a device are disclosed. The method provides an improved stability of optical coupling during assembly of the device, whereby a higher optical power levels and higher overall efficiency of the fiber coupled device can be achieved. The improvement is achieved by attaching the optical fiber to a vertical mounting surface of a fiber mount. The platform holding the semiconductor chip and the optical fiber can be mounted onto a spacer mounted on a base. The spacer has an area smaller than the area of the platform, for mechanical decoupling of thermally induced deformation of the base from a deformation of the platform of the semiconductor device. Optionally, attaching the fiber mount to a submount of the semiconductor chip further improves thermal stability of the packaged device.

24 Claims, 8 Drawing Sheets

(56) References Cited

U.S. PATENT DOCUMENTS

| | | | |
|---|---|---|---|
| 5,163,113 A * | 11/1992 | Melman | 385/31 |
| 5,619,609 A * | 4/1997 | Pan et al. | 385/136 |
| 5,682,453 A | 10/1997 | Daniel et al. | 385/99 |
| 5,692,086 A | 11/1997 | Beranek et al. | 385/94 |
| 5,926,599 A | 7/1999 | Bookbinder et al. | 385/137 |
| 6,075,914 A | 6/2000 | Yeandle | 385/49 |
| 6,190,056 B1 * | 2/2001 | Kwon et al. | 385/91 |
| 6,574,411 B2 | 6/2003 | Seguin | 385/137 |
| 6,606,435 B1 * | 8/2003 | Irie et al. | 385/52 |
| 6,608,959 B2 * | 8/2003 | Jang et al. | 385/136 |
| 6,659,659 B1 * | 12/2003 | Malone | 385/94 |
| 6,720,582 B2 * | 4/2004 | Miyokawa et al. | 257/98 |
| 6,734,517 B2 | 5/2004 | Miyokawa et al. | 257/436 |
| 6,758,610 B2 | 7/2004 | Ziari et al. | 385/92 |
| 6,792,012 B2 * | 9/2004 | Wolak et al. | 372/29.02 |
| 6,883,978 B2 | 4/2005 | Powers | 385/92 |
| 6,905,354 B1 * | 6/2005 | Zbinden | 439/137 |
| 6,961,357 B2 | 11/2005 | Moriya et al. | 372/34 |
| 7,030,422 B2 | 4/2006 | Miyokawa et al. | 257/98 |
| 7,062,133 B2 | 6/2006 | Azimi et al. | 385/52 |
| 7,263,266 B2 | 8/2007 | Williamson | 385/137 |
| 7,293,922 B2 | 11/2007 | Massey | 385/91 |
| 7,409,125 B2 | 8/2008 | Azimi et al. | 385/52 |
| 7,869,475 B2 * | 1/2011 | Rossi et al. | 372/34 |
| 2001/0026664 A1 * | 10/2001 | Tanaka et al. | 385/92 |
| 2003/0063870 A1 * | 4/2003 | Reis | 385/88 |
| 2005/0002615 A1 * | 1/2005 | Azimi et al. | 385/52 |
| 2006/0045151 A1 * | 3/2006 | Vakhshoori et al. | 372/32 |

* cited by examiner

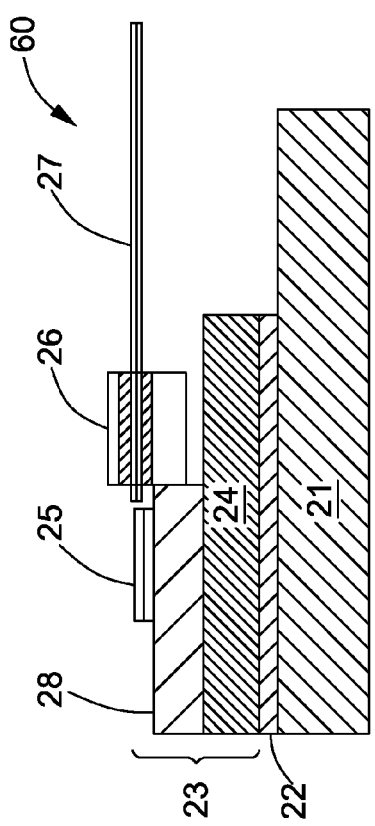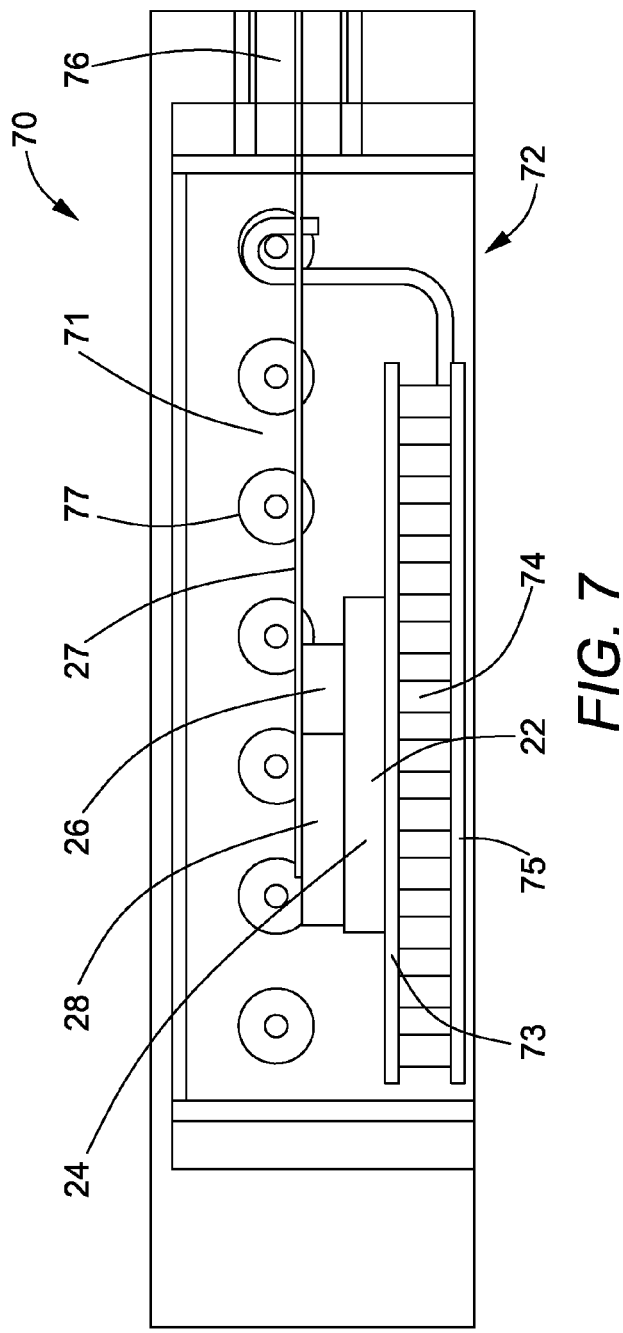

LIGHT EMITTING SEMICONDUCTOR DEVICE

CROSS-REFERENCE TO RELATED APPLICATIONS

The present invention claims priority from U.S. Provisional Patent Application No. 61/229,171, filed Jul. 28, 2009, which is incorporated herein by reference.

TECHNICAL FIELD

The present invention relates to light-emitting semiconductor devices, and in particular to assembly and a thermal packaging of fiber-coupled light-emitting semiconductor devices.

BACKGROUND OF THE INVENTION

Light-emitting semiconductor devices, such as laser diodes, laser diode arrays, and light emitting diodes (LEDs), are frequently used in conjunction with optical fibers for delivering emitted light to external objects. The efficiency of optical coupling between a semiconductor chip and an optical delivery fiber must be maintained during normal operation of the fiber coupled semiconductor device. The efficiency of optical coupling must also be maintained during assembly and packaging of the fiber coupled semiconductor device, to maximize light generation efficiency of the manufactured device.

A light emitting area of most semiconductor chips is quite small, measuring only a few microns in a direction perpendicular to a plane of thin film layers of the semiconductor device. Generally, small size of the light emitting area is a good, desirable property of a light source, because it is associated with high brightness of the source, allowing the light from the source to be tightly focused, for example. To preserve the brightness of the semiconductor source, it is preferable to use optical fibers having small core diameter. Due to small dimensions of the light emitting area and the small fiber core diameter, the optical fiber has to be precisely aligned to the semiconductor chip. Furthermore, to maintain the emitted power level over a lifetime of the device, the precise alignment between the optical fiber and the semiconductor chip must be maintained over the lifetime of the device.

Referring to FIG. 1, a prior-art fiber-coupled laser diode assembly 10 is shown. The laser diode assembly 10 has been disclosed by Ziari et al. in U.S. Pat. No. 6,758,610 assigned to JDS Uniphase corporation and incorporated herein by reference. The laser diode assembly 10 includes a base 11, a laser chip submount 12, a laser chip 13, a fiber sub-mount 14 including a top section 14A, and an optical fiber 15. The submounts 12 and 14 are affixed to the base 11 with solder layers 16, and the laser chip 13 is affixed to the laser chip submount 12 with the solder layer 16. A solder bead 17 is used to connect the optical fiber 15 to the fiber submount 14. The fiber 15 is metalized to have a metallization layer 18 for improving wettability of the optical fiber 15 by the metal solder material of the bead 17. The top section 14A has low thermal conductivity to serve as a thermal barrier during soldering operation. A front surface 19 of the optical fiber 15 is lensed to improve fiber coupling efficiency.

The optical fiber 15 is aligned to the laser chip 13 using a precision translation stage, not shown. During alignment, the laser chip 13 is energized to produce light, and the optical power of light coupled into the optical fiber 15 is measured. The optical fiber 15 is translated using the translation stage until the coupled optical power is maximized. Then, the melted bead 17 is applied to fix the fiber position. During the cooling down, however, the thermally induced stresses in the submounts 12 and 14, the laser chip 13, and the optical fiber 15 misalign the fiber 15, which results in a loss of some optical power coupled into the optical fiber 15.

Further, disadvantageously, the fiber coupling efficiency of the laser diode assembly 10 is dependent on the ambient temperature even in cases when the laser diode assembly 10 is temperature stabilized using a thermoelectric cooler (TEC). The TEC is not shown in FIG. 1. To remove the heat from the laser diode assembly 10, the base 11 is attached to a top surface of the TEC, and a bottom surface of the TEC is connected to an external heat sink, not shown. When the ambient temperature is different from the temperature of the base 11 of the laser diode assembly 10, the inside and the outside surfaces of the TEC are at different temperatures. The temperature difference results in deformation of the inside TEC surface on which the base 11 is mounted, which causes the base 11 of the laser diode assembly 10 to deform. The deformation of the base 11 results in misalignment of the optical fiber 15 relative to the laser diode chip 13, which results in a reduction of optical fiber coupling efficiency, leading to a reduction of output optical power and the conversion efficiency of the laser diode assembly 10.

Massey in U.S. Pat. No. 7,293,922, which is incorporated herein by reference, discloses a so called "laser hammering" method, which can be used to make fine adjustments of alignment of soldered optical fibers. By way of example, laser hammering can be used to align the fiber 15 to the laser diode chip 13 after cooling down of the solder bead 17, to mitigate the loss of the coupling efficiency due to the thermally induced stresses in the submounts 12 and 14 created upon cooling of the assembly. This approach requires expensive equipment and is limited in its ability to restore the lost coupling efficiency due to somewhat random nature of the effect of the laser pulses.

In U.S. Pat. No. 5,682,453, incorporated herein by reference, Daniel et al. disclose a method of bonding optical elements using glass-based bonding compounds including glass particles and a binding agent. When heat is applied, the binding agent burns away leaving the glass particles fused together. The heat may be applied using a laser. Disadvantageously, a considerable amount of heat needs to be applied locally to melt or at least "soften" the glass particles, so they can be fused together. Local heating is known to create an internal mechanical stress in a system.

In U.S. Pat. No. 6,075,914, incorporated herein by reference, Yeandle discloses an apparatus for connecting an optical fiber to an optical device. In the apparatus of Yeandle, the optical fiber is secured at a location remote from the fiber tip, and the fiber tip is placed in a V-groove to define its position. The heating of the fiber tip is thus avoided. Disadvantageously, this method is limited to passive fiber alignment, which is generally applicable for aligning multimode fibers having a relatively large core diameter.

In U.S. Pat. Nos. 6,734,517 and 7,030,422, incorporated herein by reference, Miyokawa et al. disclose a semiconductor laser diode module constructed so as to reduce the temperature dependence of the fiber coupling efficiency. In the semiconductor laser diode module of Miyokawa et al., the material of a base for supporting a laser chip is selected to match that of a fiber holder. Further, the fiber holder has two parts, one of which is mounted to the base and the other supports the fiber ferrule. The part that is mounted to the base is shaped so that it does not interfere with the laser diode mounting region of the base. Disadvantageously, the module of Miyokawa et al. is rather complex, requiring many laser welding spots to affix all the parts of all the holder elements.

It is a goal of the present invention to provide a simple and inexpensive fiber coupled semiconductor device, in which the fiber coupling efficiency exhibits no substantial decrease both at the aligning/packaging stage and during normal operation. It is also a goal of the invention to provide a method of assembly of such a device.

SUMMARY OF THE INVENTION

In accordance with the invention there is provided a method of assembly of a semiconductor device, comprising:

(a) providing a semiconductor device subassembly including a platform and a semiconductor chip extending in a first plane, the semiconductor chip thermally coupled to the platform for removing heat from the semiconductor chip;

(b) attaching a fiber mount to the semiconductor device subassembly, the fiber mount having a fiber mounting plane;

(c) optically coupling an optical fiber to the semiconductor chip for receiving light therefrom, wherein the optical fiber extends parallel to the fiber mounting plane;

wherein step (c) includes attaching the optical fiber to the fiber mount, so that the first plane is perpendicular to the fiber mounting plane, whereby a change of the optical coupling upon attaching the optical fiber to the fiber mount is lessened.

In accordance with another aspect of the invention there is further provided an assembly comprising:

a semiconductor device subassembly including a platform and a semiconductor chip extending in a first plane, the semiconductor chip thermally coupled to the platform for removing heat from the semiconductor chip;

a fiber mount attached to the semiconductor device subassembly, the fiber mount having a fiber mounting plane; and an optical fiber attached to the fiber mount in the fiber mounting plane and optically coupled to the semiconductor chip for receiving light therefrom, wherein the optical fiber extends parallel to the fiber mounting plane;

wherein the first plane is perpendicular to the fiber mounting plane, whereby a dependence of the optical coupling between the semiconductor chip and the optical fiber on temperature of the assembly is lessened.

In one embodiment, the platform is mounted on a spacer mounted on a base. A platform mounting area is smaller than a total area of a bottom surface of the platform, to reduce sensitivity of fiber alignment to a deformation of the base. In another embodiment, the semiconductor device chip is mounted on a submount. The fiber mount can be attached directly to the submount, to reduce sensitivity of fiber alignment to a deformation of the platform.

In one embodiment, the semiconductor chip is a diode laser chip. The invention can also be applied to packaging of other devices, such as light emitting diodes, for example.

BRIEF DESCRIPTION OF THE DRAWINGS

Exemplary embodiments will now be described in conjunction with the drawings in which:

FIG. 6 a side cross-sectional view of a semiconductor device assembly of the invention having fiber mount attached to the laser diode chip submount; and FIG. 7 is a side view of the semiconductor device assembly of FIG. 6 mounted on a thermo-electric cooler assembly.

DETAILED DESCRIPTION OF THE INVENTION

While the present teachings are described in conjunction with various embodiments and examples, it is not intended that the present teachings be limited to such embodiments. On the contrary, the present teachings encompass various alternatives, modifications and equivalents, as will be appreciated by those of skill in the art.

Figure 2A:
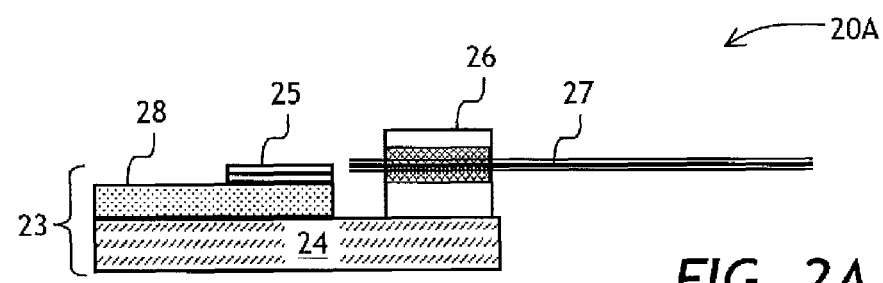
FIGS. 2A and 2B are side cross-sectional views of two embodiments of a semiconductor device assembly of the invention.

Referring to FIG. 2A, a semiconductor device assembly 20A of the present invention includes a semiconductor device subassembly 23, a fiber mount 26 attached to the semiconductor device subassembly 23, and an optical fiber 27 attached to the fiber mount 26. The semiconductor device subassembly 23 includes a platform 24, a submount 28 mounted on the platform 24, and a semiconductor chip 25 mounted on the submount 28. The semiconductor chip 25 is thermally coupled to the platform 24 through the submount 28. The semiconductor chip 25 is optically coupled to the optical fiber 27 to receive light from an active layer, not shown, of the semiconductor chip 25. The submount 28 is optional. When a submount is not used, the semiconductor chip 25 is mounted directly on the platform 24.

The active layer of the semiconductor chip 25 extends in a plane, which is perpendicular to a mounting plane of the optical fiber 27. For example, in the side view of FIG. 2A, the plane of the active layer is horizontal, and the fiber mounting plane is vertical, that is, parallel to the plane of FIG. 2A. The vertical mounting of the optical fiber 27 reduces thermal dependence of the optical coupling between the horizontally mounted semiconductor chip 25 and the optical fiber 27. An explanation of this advantageous effect will be given further below.

The semiconductor chip 25 is preferably a laser diode chip, but it can be any other type of a semiconductor chip that emits or amplifies light, for example a light-emitting diode (LED) chip or an optical semiconductor amplifier (OSA) chip. The fiber 27 is preferably a lensed optical fiber having an anamorphic fiber lens at its tip for improving optical coupling between the semiconductor chip 25 and the fiber 27. A separate lens can also be used. Alternatively, the fiber 27 can be butt-coupled to the semiconductor chip 25.

Figure 2B:
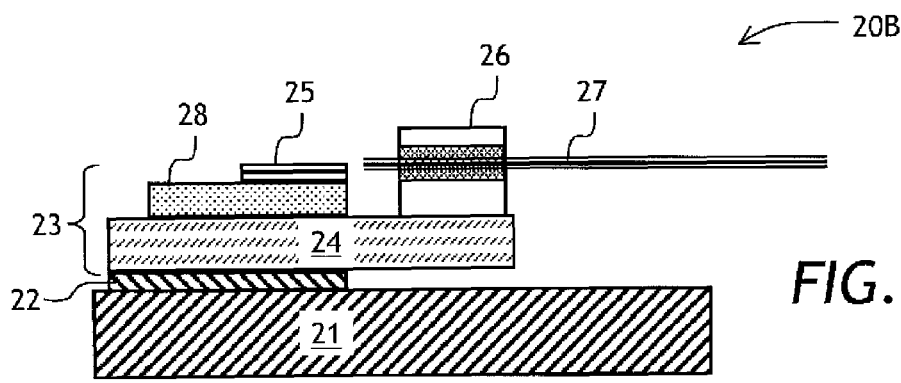

Turning to FIG. 2B, a mounted semiconductor device assembly 20B of the present invention includes the semiconductor device assembly 20A mounted on a spacer 22 mounted on a base 21. The bottom surface of the platform 24 includes a mounting area in contact with the spacer 22. The mounting area of the platform 24 is smaller than a total area of the bottom surface of the platform 24, such that a deformation of the base 21 does not impart, or at least reduces, a deformation of the platform 24. For example, a length of the mounting area of the platform 24 on the spacer 22 can be between 30% and 80% of a total length of the bottom surface of the platform 24. The lengths are measured in a direction of a length of the optical fiber 27. This is sufficient to reduce the deformation of the platform 24. As a result, sensitivity of the optical coupling between the semiconductor chip 25 and the optical fiber 27 to a deformation of the base 21 is lessened. Since the deformation of the base 21 is caused by a change of ambient temperature, as explained above, the sensitivity of the optical coupling to ambient temperature changes is also lessened.

In one embodiment, a length of the mounting area of the submount 28 on the platform 24 is between 30% and 80% of the length of the mounting area of the platform 24 on the spacer 22. These lengths are also measured in the direction of the length of the optical fiber 27. It is also desirable that the submount mounting area be disposed directly over the platform mounting area, as shown in FIG. 2B. Both of these structural features result in lessening of mechanical stress at the semiconductor chip 25 and improve optical stability.

The spacer 22 is preferably made of a material with high thermal conductivity, such as aluminum nitride or copper. By way of example, the thermal conductivity of the spacer 22 can be greater than 200 W/m*K, but preferably between 200 W/m*K and 400 W/m*K. The base 21 can be made of an inexpensive steel, although other materials can also be used.

Referring again to FIG. 2B, the semiconductor device assembly 20B can be manufactured by providing the base 21 and the spacer 22, mounting the spacer 22 on the base 21, and mounting the platform 24 on the spacer 22 so that the platform mounting area is smaller than a total area of the bottom surface of the platform 24 as explained above. The spacer 22 can be mounted first to the platform 24 or to the base 21.

Figure 3:
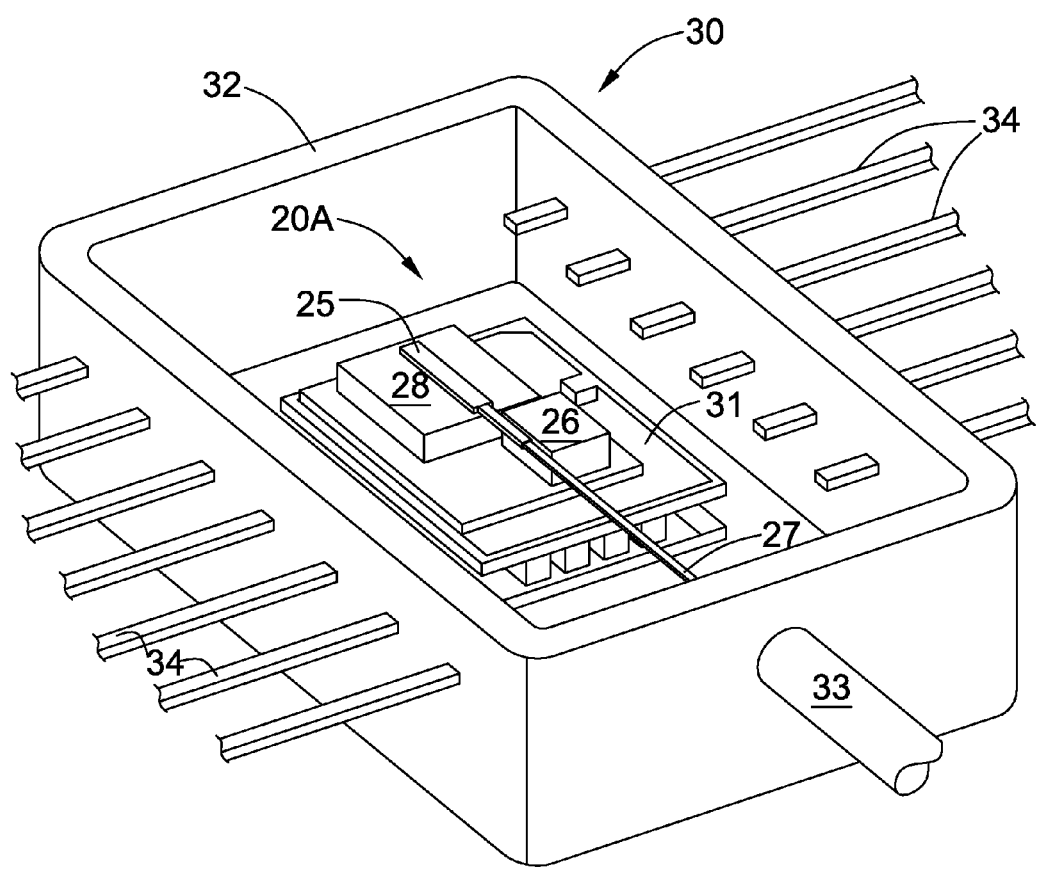
FIG. 3 is a three-dimensional view of the assembly of FIG. 2A.

Referring now to FIG. 3, a packaged semiconductor device assembly 30 includes the semiconductor device assembly 20A mounted on a thermoelectric cooler (TEC) 31 and packaged into a butterfly package 32 having a fiber feedthrough 33 and electrodes 34 for feeding electrical connections to the semiconductor chip 25 and the TEC 31 through the butterfly package 32 to an external controller of the laser diode assembly 30.

Figure 4A:
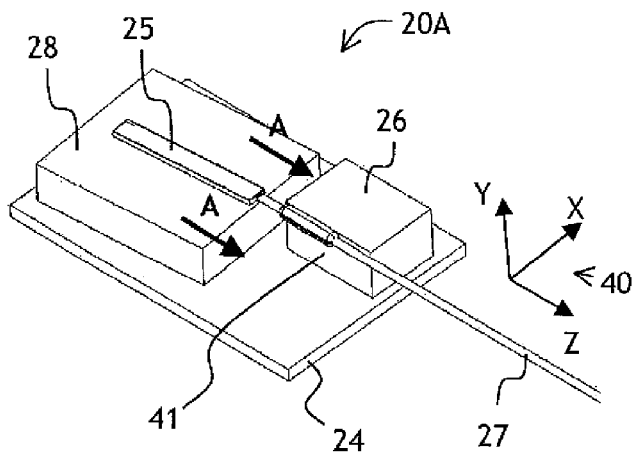
FIG. 4A is an isometric view of the assembly of FIG. 2A showing attachment of a lensed optical fiber to a vertical plane.
Figure 4B:
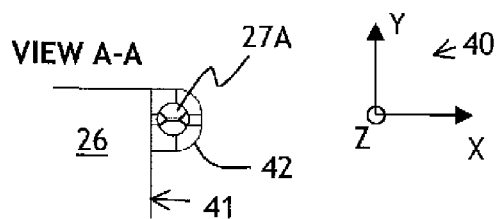
FIG. 4B is a frontal view the lensed optical fiber of FIG. 4A.
Figure 4C:
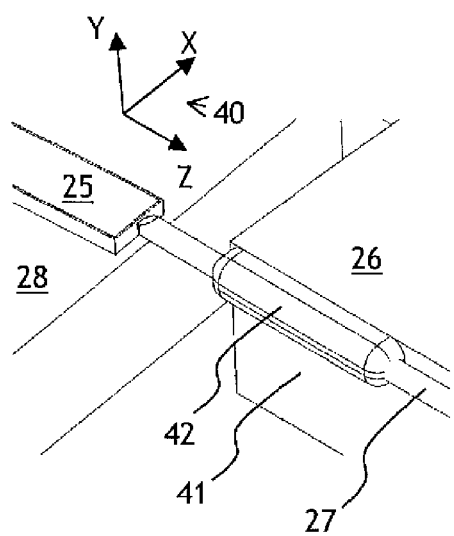
FIG. 4C is a magnified isometric view of the assembly of FIG. 2A.

Referring now to FIGS. 4A to 4C, the semiconductor chip 25 is disposed in the XZ plane, as XYZ coordinate system 40 indicates. The optical fiber 27 is attached to a vertical surface 41 of the fiber mount 26, disposed in the YZ plane. Thus, the plane of the active layer of the semiconductor device 25 is perpendicular to the plane of the vertical mounting surface 41, to which the optical fiber 27 is mounted. This geometry of fiber attachment results in improved stability of optical coupling during the assembly process, for the following reason.

Figure 1:
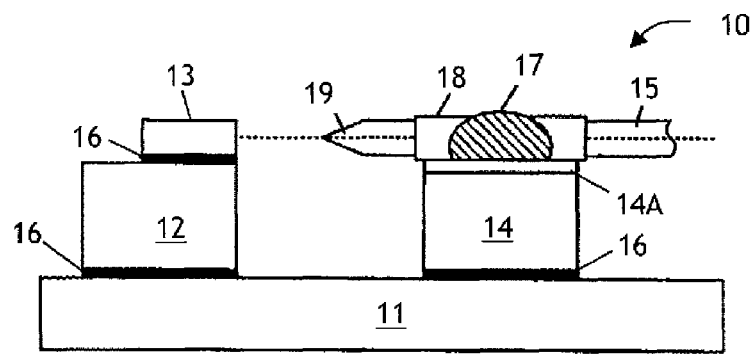
FIG. 1 is a side view of a prior-art fiber-coupled laser diode assembly.

The optical fiber 27 is attached, preferably using an ultraviolet curable (UV curable) epoxy 42, to the vertical surface 41. When the fiber 27 is attached, it bends somewhat in the XZ plane due to shrinking of the UV epoxy 42 upon cure, as well as due to thermal mismatches between the fiber 27, the fiber mount 26, and the cured UV epoxy 42. The bending results in movement of a tip of the fiber 27 along the X axis. If the fiber 27 were attached to a horizontal surface (parallel to the XZ plane), as is common in the prior art and as is in fact shown on the prior-art FIG. 1, then the fiber tip would be moving along the Y axis. However, moving along the Y axis results in a bigger decrease of the fiber coupling efficiency, because the spot size of the light emitting area of the semiconductor chip 25 is almost always smaller in the Y-direction than in the X-direction. Therefore, mounting the fiber 27 to the vertical surface 41 of the fiber mount 26 results in an improvement of stability of the optical coupling in the semiconductor device assembly 20A. Advantageously, the improved stability is observed not only during building of the semiconductor device assembly 20A, but also during normal operation of the semiconductor device assembly 20A or the mounted semiconductor assembly 20B.

Referring specifically to FIG. 4B, the optical fiber 27 is preferably a lensed optical fiber having an anamorphic fiber lens 27A at its tip for improving the coupling efficiency. The fiber lens 27A is preferably anamorphic because, as noted above, the semiconductor chip 25 has an anamorphic light field, which needs to be coupled into the round optical fiber 27. The anamorphic fiber lens 27A has mutually orthogonal first and second optical planes parallel to the XZ and YZ planes. The focal length of the anamorphic fiber lens 27A in the first plane is generally different from the focal length in the second plane.

The anamorphic fiber lens 27A is preferably a chisel lens or an angle chisel lens or a biconic lens. The angle chisel lens can have a focusing power in both optical planes or only in one optical plane. A cylindrical lens is also considered to be an anamorphic lens. Furthermore, a non-anamorphic fiber lens, such as a less expensive conical lens formed at the fiber tip, can also be used in place of the anamorphic fiber lens 27A.

Figure 4D:
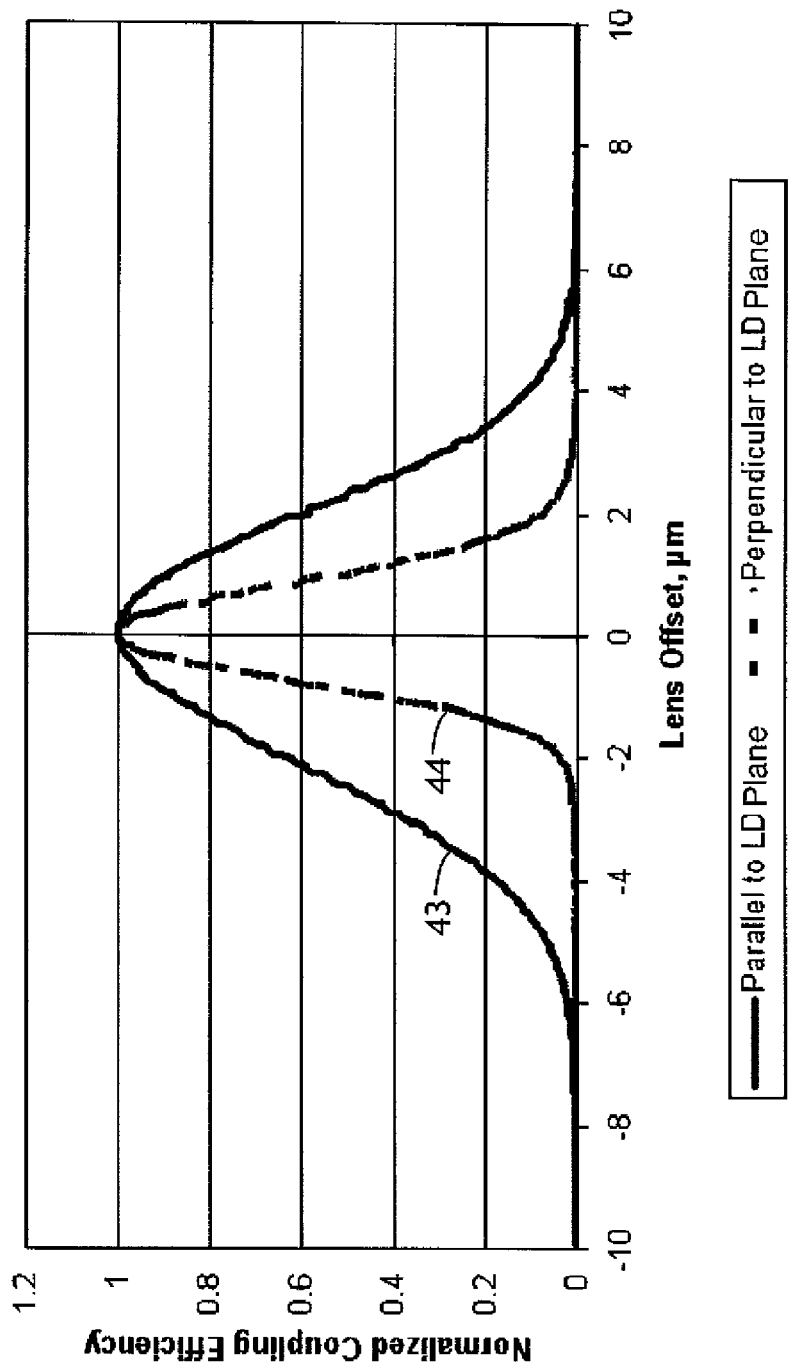
FIG. 4D is a dependence of optical coupling efficiency on fiber tip offset in the assembly of FIG. 2A.

Referring now to FIG. 4D, measured normalized optical coupling efficiency is graphed as a function of a lateral offset of the lensed fiber tip 27A in the semiconductor device assembly 20A. For this particular example, an angle chisel lens was used. A bell-shaped function 43 corresponding to the X-offset of the lensed fiber tip 27A is wider than a bell-shaped function 44 corresponding to the Y-offset of the lensed fiber tip 27A. As explained above, mounting of the optical fiber 27 to the vertical surface 41 of the fiber mount 26 results in fiber predominantly shifting in the X-direction and not in the Y-direction. Due to the fact that the X-offset function 43 is not as steep as the Y-offset function 44, the stability of optical coupling of the fiber 27 to the semiconductor chip 25 is improved when the optical fiber 27 is attached to a vertical surface, such as the vertical surface 41 of the fiber mount 26.

The fiber 27 is actively aligned by holding the fiber 27 with mechanical tweezers, not shown, to achieve maximum coupling of the light emitted by the semiconductor chip 25 into the fiber. Once the desired position is obtained, the UV curable epoxy fluid 42 is dispensed between the fiber 27 and the fiber mount 26.

The UV epoxy 42 is cured using a UV light source. For improved uniformity of curing, the fiber mount 26 can be made out of a material substantially transparent to UV light emitted by the UV light source. Herein, the phrase "substantially transparent" is taken to mean transparent enough, so that the UV epoxy 42 is uniformly cured. For example, the fiber mount 26 can be made out of a borosilicate glass having a 90% transparency at a wavelength of 360 nm.

Upon UV curing the UV epoxy 42, the fiber 27 is released from the tweezers, and the semiconductor device assembly 20A is preferably post-cured at an elevated temperature. It is crucial that at this step the fiber coupling does not change; for this reason, an epoxy with low shrinkage upon cure (less than 1% of shrinkage), and low coefficient of thermal expansion (6 ppm/° C. to 20 ppm/° C.) should preferably be used. During the post-cure, the temperature should be ramped up slowly, for example at a rate of 0.5 to 2.0 degrees per minute.

According to one embodiment of the invention, the UV curing is preferably performed at an elevated temperature higher than ambient temperature, for example between 35° C. and 70° C., preferably at 65° C., for increasing the resulting glass transition temperature of the cured UV epoxy 42 so that its glass transition temperature of the cured UV epoxy 42 exceeds the ambient temperature before releasing the tweezers. It is further preferable to match thermal expansion coefficient of the fiber mount 26 to a thermal expansion coefficient of the semiconductor device subassembly 23 to within 5 ppm/° C., for reducing a change of the optical coupling upon curing of the UV epoxy 42 at the elevated temperature. For example, when the thermal expansion coefficient of the semiconductor device subassembly 23 is 4 ppm/° C., the fiber mount 26 should preferably have a thermal expansion coefficient of less than 9 ppm/° C.

Figure 4E:
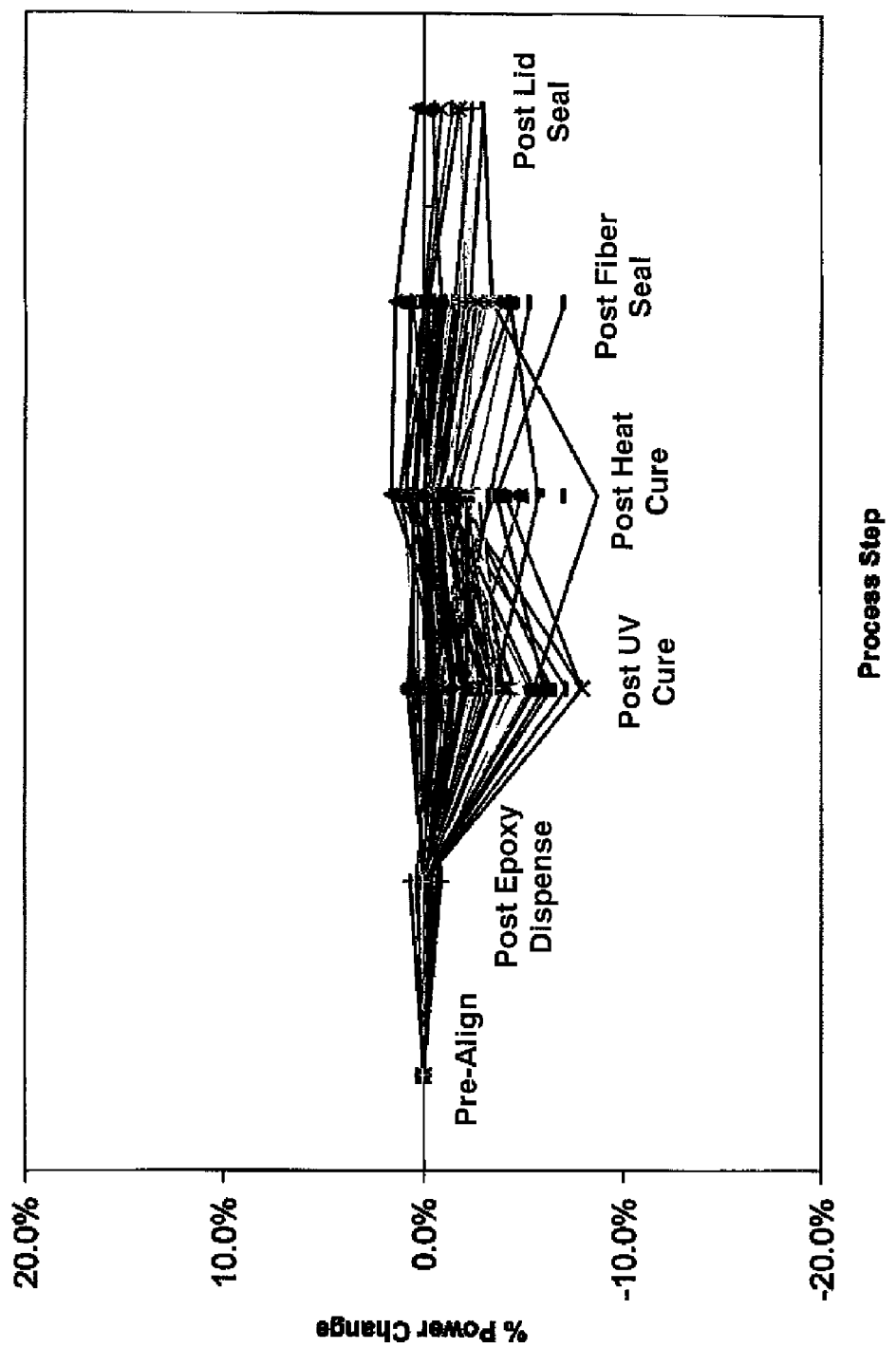
FIG. 4E is a measured change of optical coupling efficiency during assembly of a number of prototypes of the semiconductor device of FIG. 2A.

Turning to FIG. 4E, the results of measuring stability of optical coupling in a number of manufactured prototypes of the semiconductor device assembly 20A are presented. In FIG. 4E, a normalized change of coupled optical power is plotted for the "Pre-Align", "Post-Epoxy Dispense", "Post UV Cure", Post Heat Cure", "Post Fiber Seal", and "Post Lid Seal" stages of the assembly. It is seen that the biggest drop of the coupled optical power occurs upon UV curing. Nonetheless, in approximately 50% of cases, the coupled power increased somewhat upon the post-cure, probably due to release of internal stresses. The overall coupled optical power drop was less than 9%, being less than 5% in most cases. In comparison, the power drop after post cure was greater than 20% in the case where the fiber 27 was epoxied to a top surface of the fiber mount 26, as is normally done in the prior art. The results shown in FIG. 4E demonstrate that mounting the optical fiber 27 according to the present invention resulted in the optical coupling stability improvement of at least 4 times in most cases (from 20% to 5% coupled optical power drop), and at least 2 times in all cases (from 20% to 9% coupled optical power drop).

Figure 5A:
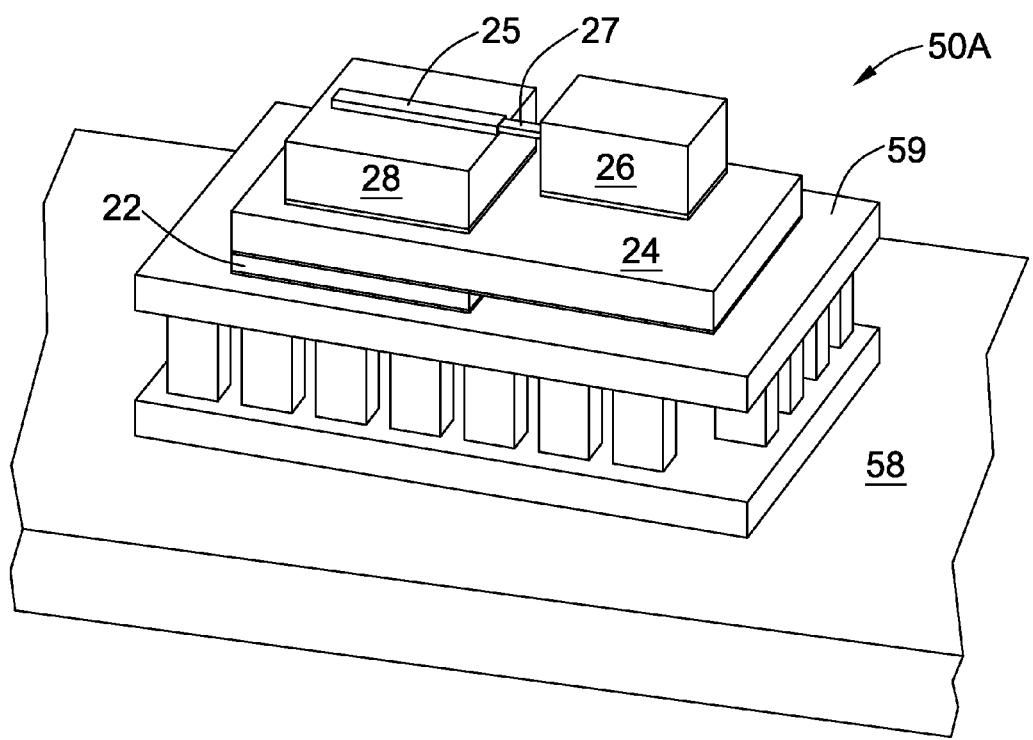
FIG. 5A is a three-dimensional view of the laser diode assembly of FIG. 2B mounted on a thermo-electric cooler (TEC) showing, in exaggerated form, a deformation of the TEC.

Referring now to FIG. 5A, a mounted semiconductor device assembly 50A includes the mounted semiconductor device assembly 20B of FIG. 2B, having the spacer 22, the platform 24, the submount 28, the semiconductor device chip 25, the fiber mount 26, and the optical fiber 27. A thermoelectric cooler (TEC) 59 is an alternative embodiment of the base 21. The TEC 59 is mounted on an external heat sink 58. The TEC 59 is required to maintain the semiconductor device chip 25 at a working temperature, and the external heat sink 58 is required to remove the heat released during TEC operation. The TEC 59 is shown deformed due to the temperature difference created by TEC operation, as explained above. The deformation of the TEC 59 is exaggerated to illustrate the advantage of using the spacer 22 to make sure that the platform 24 is not deformed upon deformation of the TEC 59, whereby sensitivity of the optical coupling between the semiconductor chip 25 and the optical fiber 27 to deformation of the TEC 59 is lessened.

Figure 5B:
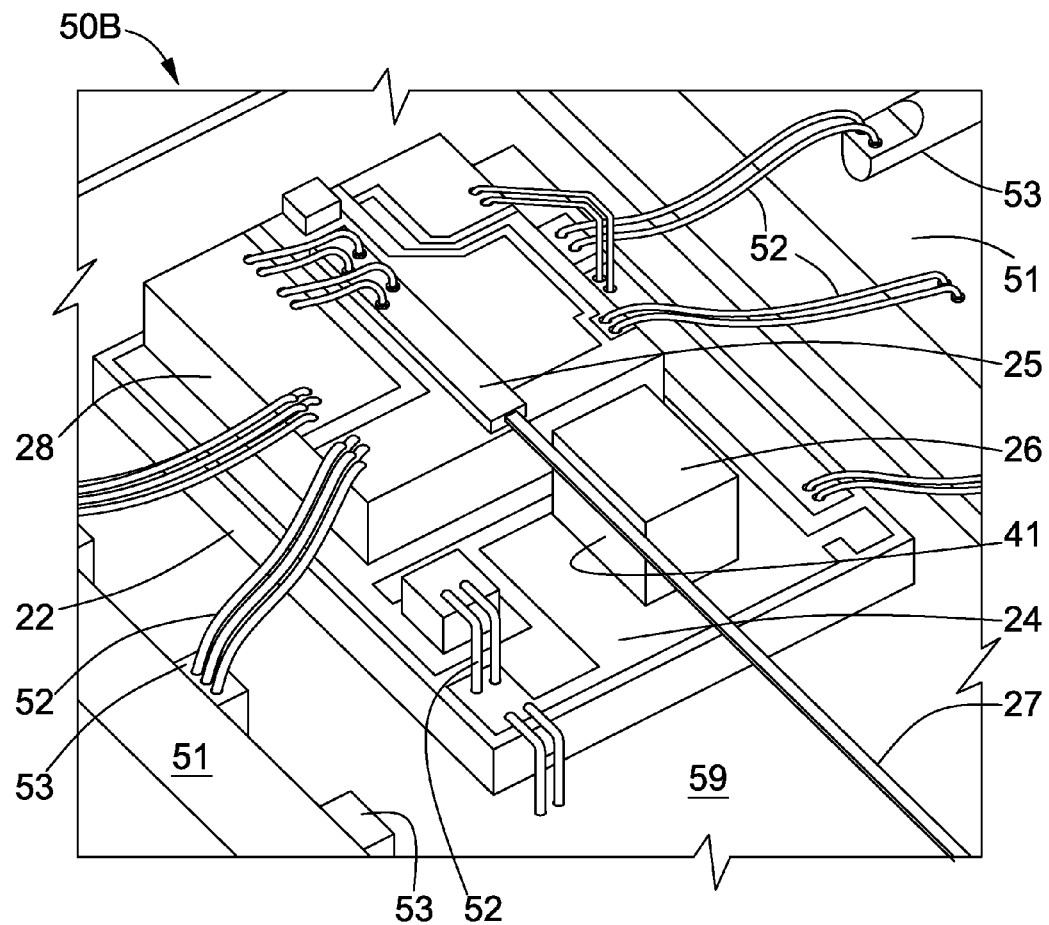
FIG. 5B is a three-dimensional view of the laser diode assembly of FIG. 5A packaged into a butterfly package.

Turning to FIG. 5B, a packaged laser diode assembly 50B includes the mounted semiconductor device assembly 50A of FIG. 5A and a butterfly package 51 (only partially seen in FIG. 5) for enclosing the semiconductor device assembly 50A, wirebonds 52 for providing necessary electrical connections, and electrodes 53 connected to the wirebonds 52, for feeding the electrical connections through the butterfly package 51 to an external controller of the laser diode assembly 50B. The TEC 59 is attached to the butterfly package 51. The butterfly package 51 is an alternative embodiment of the heat sink 58 of FIG. 5A.

Referring to FIG. 6, a semiconductor device assembly 60 has the same elements as the semiconductor device assembly 20A of FIG. 4A. One difference between the semiconductor assemblies 20A and 60 is that in the semiconductor device assembly 60, the fiber mount 26 is attached to the laser diode chip submount 28 and not to the platform 24, i.e. suspended above and separate from the platform 24. This additionally improves thermal stability of the optical coupling, because the deformation of the platform 24 has practically no impact on the position of the fiber mount 26. Preferably, the optical fiber 27 is mounted to the vertical side 41 of the fiber mount 26. Further, preferably, the optical fiber is lensed, having the anamorphic lens 27A at its tip. The spacer 22 and the base 21 are optional elements of the semiconductor device assembly 60. The platform 24 can be mounted directly into a package, such as the butterfly package 51 of FIG. 5B, or onto the TEC 59 placed inside the butterfly package 51. In one embodiment, the platform 24 is an integral part of the enclosure, in which case the spacer 22 and the base 21 may not be required.

Turning now to FIG. 7, a packaged semiconductor device assembly 70 of the invention includes the semiconductor device assembly 60 of FIG. 6. A TEC 72 is an alternative embodiment of the base 21 in FIG. 6. The TEC 72 has an upper plate 73, a plurality of Peltier elements 74, and a bottom plate 75. The TEC 72 is mounted within a hermetic package 71 having a hermetic feedthrough 76 for the optical fiber 27 and hermetic electrical feedthroughs 77 for the electrical contacts. The fiber mount 26 is connected to the submount 28. The optical fiber 27 is attached to the fiber mount 26 preferably using a UV curable epoxy. Using the UV curable epoxy is advantageous because it allows one to quickly attach elements together without heating. Of course, other types of epoxies can be used, as well as glass or metal soldering or brazing. The hermetic package 71 can be used for packaging of other embodiments of semiconductor devices of the invention, such as the semiconductor devices 20A, 20B, 30, and 50A. A non-hermetic package can also be used.

When the optional submount 28 is used in the semiconductor device assemblies 20A, 20B, 30, 50A, 50B, 60, or 70, the submount 28 can be first mounted to the semiconductor chip 25 and then to the platform 24, or the other way around. For the semiconductor device assemblies 60 and 70, the fiber mount 26 is attached to the submount 28. In general, the components of the semiconductor device assemblies 20A, 20B, 30, 50A, 50B, 60, and 70 can be affixed together using epoxying, soldering, brazing, laser welding, or any other attachment method suitable for the materials used.

What is claimed is:

1. A method of assembly of a semiconductor device, comprising:
   (a) providing a semiconductor device subassembly having a chip mounting surface and including a platform and a semiconductor chip mounted flat on the chip mounting surface and thermally coupled to the platform for removing heat from the semiconductor chip;
   (b) attaching a fiber mount to the semiconductor device subassembly, the fiber mount having a planar fiber mounting surface;
   (c) optically coupling an optical fiber to the semiconductor chip for receiving light therefrom, wherein the optical fiber extends lengthwise parallel to the fiber mounting surface and the chip mounting surface; and
   (d) attaching a bare section of the optical fiber directly to the fiber mounting surface, wherein the fiber mounting surface is disposed perpendicular to the chip mounting surface, whereby a change of the optical coupling upon attaching the optical fiber to the fiber mount is lessened.

2. The method of claim 1, wherein step (d) includes epoxying the bare section of the optical fiber directly to the fiber mounting surface.

3. The method of claim 2, wherein step (d) includes curing a UV curable epoxy with a UV light source.

4. The method of claim 3, wherein the fiber mount is substantially transparent to UV light emitted by the UV light source.

5. The method of claim 3, wherein in step (d) includes heating the UV curable epoxy to an elevated temperature higher than ambient temperature, for increasing a glass transition temperature of the UV curable epoxy.

6. The method of claim 5, wherein the UV curable epoxy is heated to a temperature between 35° C. and 70° C.

7. The method of claim 5, including matching a coefficient of thermal expansion of the fiber mount to a coefficient of thermal expansion of the semiconductor device subassembly to within 5 ppm/° C., for reducing a change of the optical coupling upon curing of the UV curable epoxy at the elevated temperature.

8. The method of claim 1, wherein step (a) includes
   (i) providing a submount including a top surface comprising the chip mounting surface, and a bottom surface disposed opposite the top surface, the bottom surface having a submount mounting area;
   (ii) mounting the semiconductor chip directly on the chip mounting surface of the submount;
   (iii) mounting the submount mounting area directly on the platform, for supporting the semiconductor chip and for thermally coupling the semiconductor chip to the platform;
   wherein in step (b), the fiber mount is attached directly to the submount, whereby sensitivity of the optical coupling between the semiconductor chip and the optical fiber to deformation of the platform is lessened.

9. The method of claim 8, wherein the platform has a bottom surface with a platform mounting area, the method further including
   (e) providing a thermoelectric cooler and a spacer;
   (f) mounting the spacer on a top surface of the thermoelectric cooler; and
   (g) mounting the platform mounting area on the spacer, so that the platform mounting area is smaller than each of: a total area of the bottom surface of the platform; and a total area of the top surface of the thermoelectric cooler, whereby sensitivity of the optical coupling between the semiconductor chip and the optical fiber to deformation of the thermoelectric cooler is lessened.

10. The method of claim 9, wherein in step (g), the platform mounting area and the bottom surface of the platform each have a length in a direction of a length of the optical fiber, wherein the length of the platform mounting area is between 30% and 80% of the length of the bottom surface of the platform.

11. The method of claim 1, wherein step (d) includes glass soldering the bare section of the optical fiber directly to the fiber mounting surface.

12. An assembly comprising:
   a semiconductor device subassembly having a chip mounting surface and including a platform and a semiconductor chip mounted flat on the chip mounting surface and thermally coupled to the platform for removing heat from the semiconductor chip;
   a fiber mount attached to the semiconductor device subassembly, the fiber mount having a planar fiber mounting surface; and
   an optical fiber having a bare fiber section attached directly to the fiber mounting surface and optically coupled to the semiconductor chip for receiving light therefrom, wherein the optical fiber extends lengthwise parallel to the fiber mounting surface and the chip mounting surface;
   wherein the fiber mounting surface is disposed perpendicular to the chip mounting surface, whereby a dependence of the optical coupling between the semiconductor chip and the optical fiber on temperature of the assembly is lessened.

13. The assembly of claim 12, wherein the bare fiber section of the optical fiber is attached directly to the fiber mounting surface with an epoxy.

14. The assembly of claim 13, wherein the epoxy is a UV curable epoxy.

15. The assembly of claim 14, wherein the fiber mount is substantially transparent to UV light for curing the UV curable epoxy.

16. The assembly of claim 15, wherein a coefficient of thermal expansion of the fiber mount differs from a coefficient of thermal expansion of the semiconductor device subassembly by less than 5 ppm/° C.

17. The assembly of claim 12, wherein the optical fiber is a lensed optical fiber having an anamorphic fiber lens having mutually orthogonal first and second optical planes parallel to the chip mounting surface and the fiber mounting surface, respectively.

18. The assembly of claim 12, wherein the semiconductor device subassembly further includes a submount including opposed top and bottom surfaces, wherein the top surface includes the chip mounting surface on which the semiconductor chip is mounted, and wherein the bottom surface includes a submount mounting area for mounting the submount directly on the platform, for thermally coupling the semiconductor chip to the platform.

19. The assembly of claim 18, wherein the fiber mount is attached directly to the submount, whereby a dependence of the optical coupling between the semiconductor chip and the optical fiber on temperature of the assembly is lessened.

20. The assembly of claim 19, wherein the platform has a bottom surface with a platform mounting area, the assembly further including a thermoelectric cooler and a spacer mounted on a top surface thereof,
   wherein the platform mounting area is mounted on the spacer; and
   wherein the platform mounting area is smaller than each of: a total area of the bottom surface of the platform; and a total area of the top surface of the thermoelectric cooler, whereby sensitivity of the optical coupling between the semiconductor chip and the optical fiber to deformation of the thermoelectric cooler is lessened.

21. The assembly of claim 20, wherein the platform mounting area and the bottom surface of the platform each have a length in a direction of a length of the optical fiber, wherein the length of the platform mounting area is between 30% and 80% of the length of the bottom surface of the platform.

22. The assembly of claim 21, wherein the submount mounting area is disposed over the platform mounting area.

23. The assembly of claim 12, wherein the semiconductor chip is a laser diode chip.

24. The assembly of claim 12, wherein the bare fiber section of the optical fiber is attached directly to the fiber mounting surface with a glass solder.

* * * * *